(12) United States Patent
Uchida

(10) Patent No.: US 8,008,194 B2
(45) Date of Patent: Aug. 30, 2011

(54) METHOD OF MANUFACTURING SEMICONDUCTOR DEVICE

(75) Inventor: Masanori Uchida, Kawasaki (JP)

(73) Assignee: Fujitsu Semiconductor Limited, Yokohama (JP)

( * ) Notice: Subject to any disclaimer, the term of this patent is extended or adjusted under 35 U.S.C. 154(b) by 0 days.

(21) Appl. No.: 11/831,234

(22) Filed: Jul. 31, 2007

(65) Prior Publication Data

US 2008/0220602 A1 Sep. 11, 2008

(30) Foreign Application Priority Data

Mar. 6, 2007 (JP) ................................. 2007-055494

(51) Int. Cl.
*H01L 21/44* (2006.01)

(52) U.S. Cl. ........ 438/655; 438/656; 438/660; 438/683; 438/685; 438/686

(58) Field of Classification Search .................. 438/655, 438/656, 660, 682, 683, 685, 686, FOR. 360
See application file for complete search history.

(56) References Cited

U.S. PATENT DOCUMENTS

| | | | | |
|---|---|---|---|---|
| 5,331,072 A | * | 7/1994 | Yokomichi et al. | 526/258 |
| 5,937,300 A | * | 8/1999 | Sekine et al. | 438/300 |
| 5,981,788 A | * | 11/1999 | Ofori et al. | 558/274 |
| 6,114,565 A | * | 9/2000 | Erman et al. | 558/315 |
| 6,323,519 B1 | * | 11/2001 | Gardner et al. | 257/336 |
| 6,329,695 B1 | * | 12/2001 | Duane et al. | 257/408 |
| 6,380,053 B1 | * | 4/2002 | Komatsu | 438/517 |
| 6,825,520 B1 | * | 11/2004 | Shue et al. | 257/309 |
| 7,135,386 B2 | * | 11/2006 | Kataoka et al. | 438/471 |
| 7,452,555 B2 | * | 11/2008 | Childs | 424/666 |
| 2001/0020723 A1 | * | 9/2001 | Gardner et al. | 257/368 |
| 2006/0046143 A1 | * | 3/2006 | Nakai et al. | 429/231.1 |
| 2007/0071999 A1 | * | 3/2007 | Ito et al. | 428/675 |
| 2007/0176224 A1 | * | 8/2007 | Yaegashi | 257/315 |

FOREIGN PATENT DOCUMENTS

| | | |
|---|---|---|
| JP | 200091290 A | 3/2000 |
| JP | 2004186698 A | 7/2004 |
| JP | 2006128497 A | 5/2006 |

* cited by examiner

*Primary Examiner* — N Drew Richards
*Assistant Examiner* — Joannie A Garcia
(74) *Attorney, Agent, or Firm* — Fujitsu Patent Center

(57) ABSTRACT

The semiconductor manufacturing method comprises the step of forming a metal alloy film of an alloy of a metal of Ni or others and a noble metal over a semiconductor substrate containing a region where silicon is partially exposed; the step of selectively reacting the silicon in the region and the metal alloy film by thermal processing to form metal silicide film containing the metal of Ni or others and the noble metal on the region; and the step of removing the metal alloy film remaining unreacted by using a solution containing hydrogen peroxide with a transition metal, which has higher ionization tendency than the metal of Ni or others, dissolved in.

18 Claims, 8 Drawing Sheets

METHOD OF MANUFACTURING
SEMICONDUCTOR DEVICE

CROSS-REFERENCE TO RELATED
APPLICATIONS

This application is based upon and claims the benefit of priority from the prior Japanese Patent Application No. 2007-055494, filed on Mar. 6, 2007, the entire contents of which are incorporated herein by reference.

BACKGROUND OF THE INVENTION

The present invention relates to a method of manufacturing a semiconductor device, more specifically, a method of manufacturing a semiconductor device which forms a metal silicide film selectively on a gate electrode and source/drain regions of a MISFET.

In the recent semiconductor devices, in order to suppress the resistance rise of the electrodes to improve the drive performances, generally a metal silicide, which is low resistive, is formed on the electrodes.

Usually, the metal silicide in the electrodes are formed by selectively silicidizing the electrodes by the so-called salicide (self-aligned silicide) process. salicide process is specifically a process of forming a metal film of Ni or others over a substrate surface, reacting, in regions where silicon is exposed, the metal film with the silicon by thermal processing to selectively form metal silicide film and then removing the metal film remaining unreacted with the silicon (refer to, e.g., Reference 1 (Japanese published unexamined patent application No. 2000-091290), Reference 2 (Japanese published unexamined patent application No. 2004-186698) and Reference 3 (Japanese published unexamined patent application No. 2006-128497)).

Recently, the metal silicide is formed by using an alloy of a metal for forming the metal silicide and a noble metal added thereto. Its most advantageous merit is that the noble metal is suitably diffused in the grain boundaries of the metal silicide to thereby form the metal silicide crystal homogeneous, whereby abnormal growth of crystal grains and phase transition can be suppressed.

However, the noble metal material is difficult to be removed with the etchants, such as sulfuric acid hydrogen peroxide mixture (SPM), hydrochloric acid hydrogen peroxide mixture and ammonia hydrogen peroxide mixture (APM), which are usually used to remove the metal film remaining unreacted, and in the process of removing the alloy remaining unreacted, the noble metal remains as residues in the device isolation regions, etc. other than the electrodes and resultantly causes short-circuits between the electrodes.

As a method for removing the noble metal is known to use aqua regia. However, aqua regia is seldom used in the usual semiconductor manufacturing process, and it is essential to incorporate an equipment specialized for the aqua regia. Unless an equipment is specialized for the aqua regia, incidental operations, such as the addition of specifications of the feed and discharge of aqua regia, the tank cleaning, etc., are increased, which is a cause for operational cost increase.

SUMMARY OF THE INVENTION

According to one aspect of the present invention, there is provided a method of manufacturing a semiconductor device comprising: forming a metal alloy film of a metal and a noble metal over a semiconductor substrate having a region where silicon is partially exposed; selectively reacting by thermal processing the silicon in the region with the metal alloy film to form a metal silicide film containing the metal and the noble metal on the region; and removing the metal alloy film remaining unreacted by using a solution containing hydrogen peroxide with a transition metal, which has higher ionization tendency than the metal, dissolved in.

DETAILED DESCRIPTION OF THE PREFERRED
EMBODIMENTS

The method of manufacturing the semiconductor device according to an embodiment of the present invention will be explained with reference to FIGS. 1A-8.

Figure 6A:
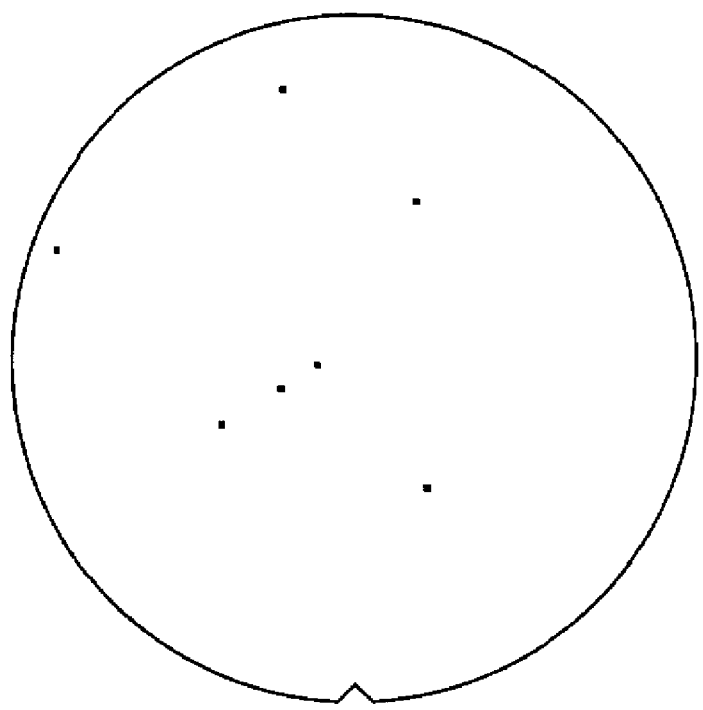
FIGS. 6A and 6B are plan views showing distributions of defects over the silicon substrate after the unreacted part of the metal alloy film has been removed.
Figure 6B:
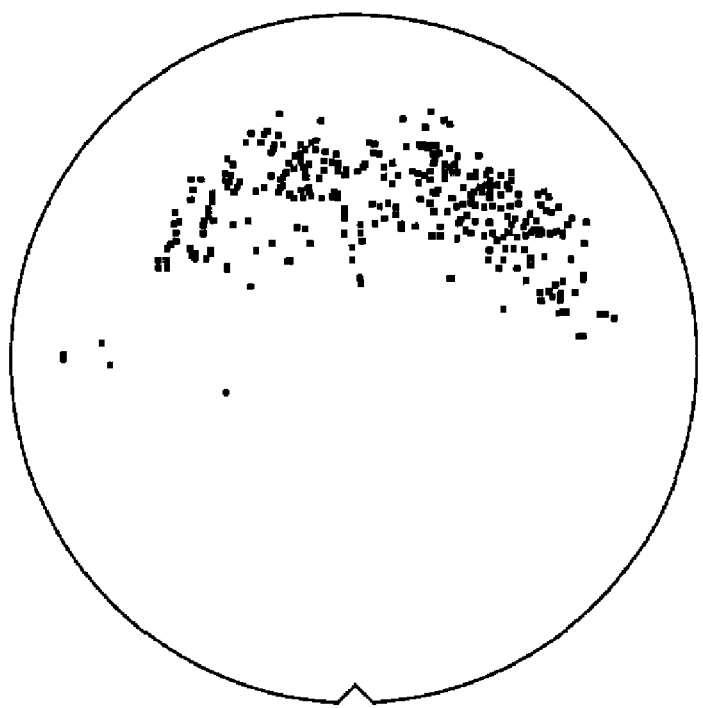
Figure 7:
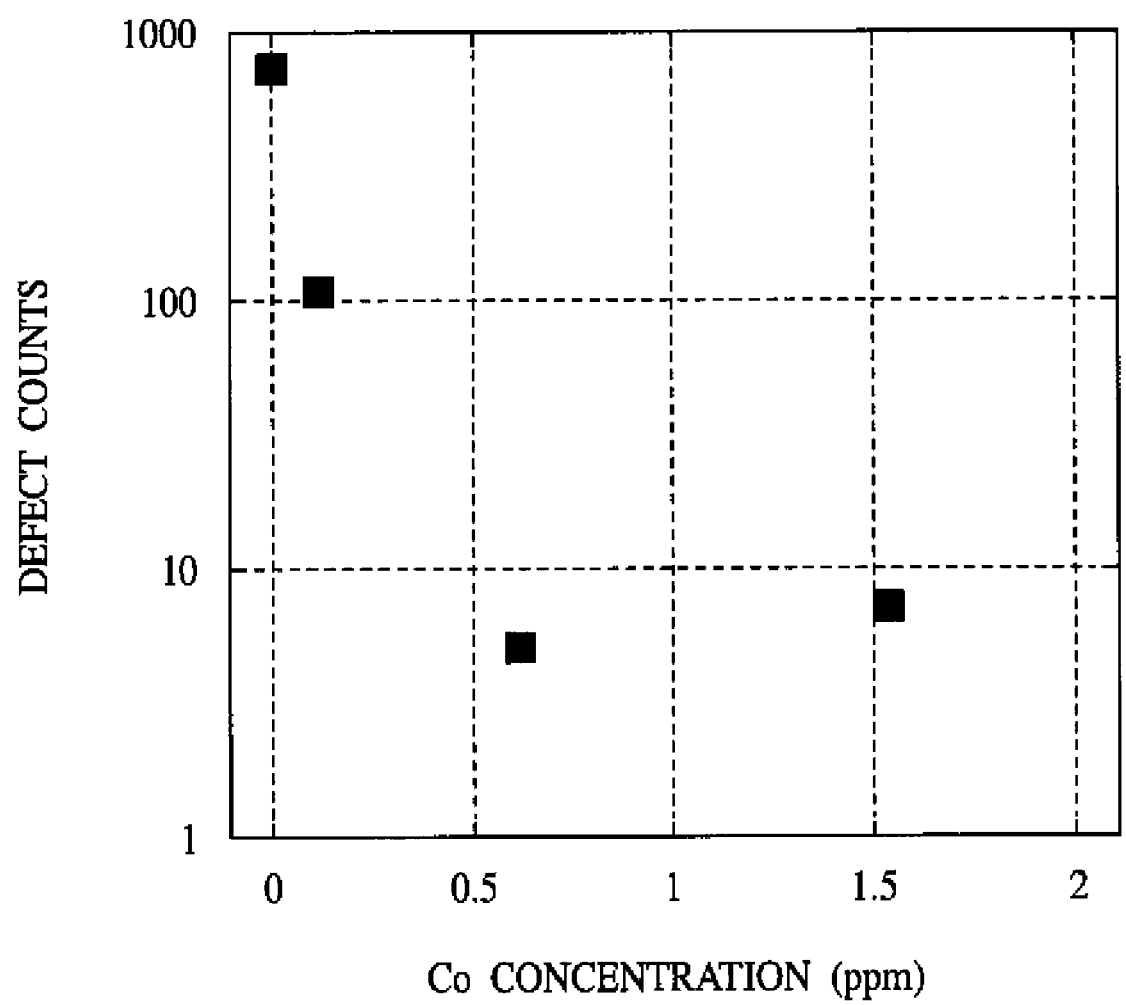
FIG. 7 is a graph of the change of the number of defects given with the change of the concentration of cobalt dissolved in the etching solution.
Figure 8:
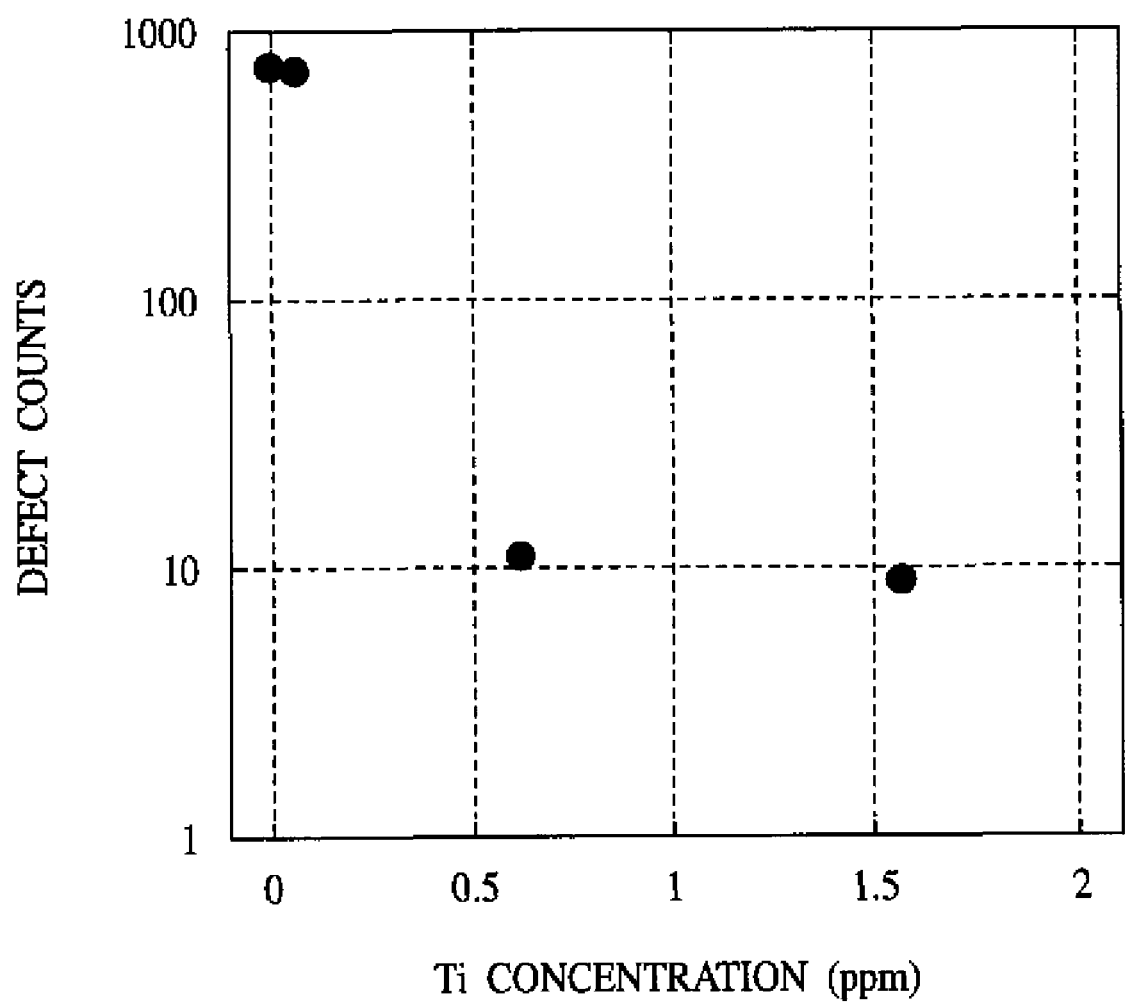
FIG. 8 is a graph of the change of the number of defects given with the change of the concentration of titanium dissolved in the etching solution.

FIGS. 1A-3C are sectional views showing the method of manufacturing the semiconductor device according to the present embodiment. FIGS. 4A-5C are views showing the method of removing the unreacted part of the metal alloy film in the method of manufacturing the semiconductor device according to the present embodiment. FIGS. 6A and 6B are plan views showing distributions of defects over the silicon substrate after the unreacted part of the metal alloy film has been removed. FIG. 7 is a graph of the change of the number of defects given with the change of the concentration of cobalt dissolved in the etching solution. FIG. 8 is a graph of the change of the number of defects given with the change of the concentration of titanium dissolved in the etching solution.

First, in the surface of a silicon substrate 10, a device isolation film 12 for defining active regions to isolate elements from each other is formed by, e.g., STI (Shallow Trench Isolation) method.

Figure 1A:
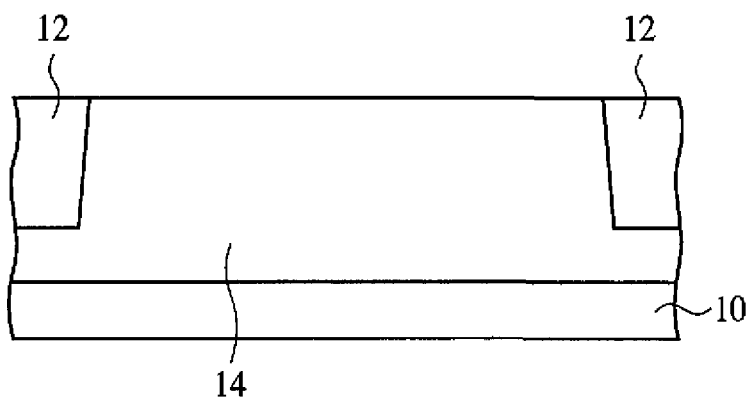
FIGS. 1A-1C, 2A-2C and 3A-3C are sectional views showing the method of manufacturing the semiconductor device according to an embodiment of the present invention.

Then, the ion implantation for the well implantation, the channel stop implantation, the channel implantation, etc. is made to form a well 14 of prescribed conductive type in the active regions of the silicon substrate 10 (FIG. 1A). The well 14 is, e.g., a p-well for n-channel MISFET forming region and, e.g., n-well for the p-channel MISFET forming region.

Next, the surface of the silicon substrate 10 is thermally oxidized by, e.g., thermal oxidation method to form a gate insulating film 16 of, e.g., silicon oxide film on the active region of the silicon substrate 10 defined by the device isolation film 12.

Figure 1B:
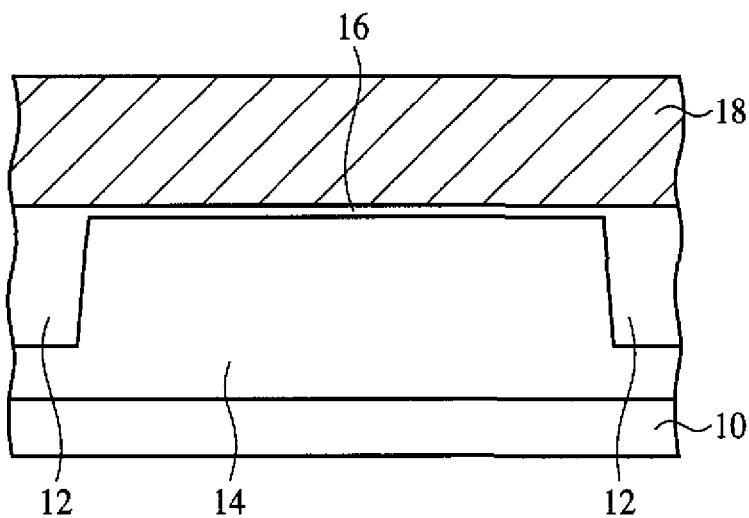

Next, over the gate insulating film 16, a polycrystalline silicon film 18 is deposited by, e.g., CVD method (FIG. 1B).

Figure 1C:
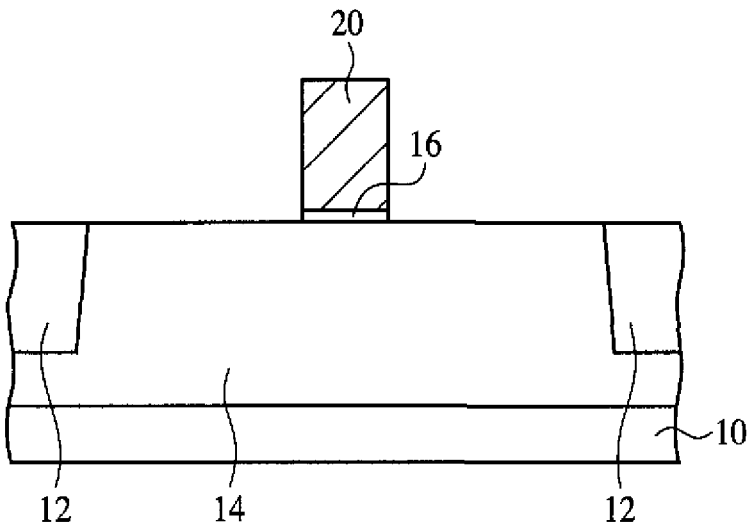

Next, the polycrystalline silicon film 18 is patterned by photolithography and dry etching to form a gate electrode 20 of the polycrystalline silicon film 18 (FIG. 1C).

Figure 2A:
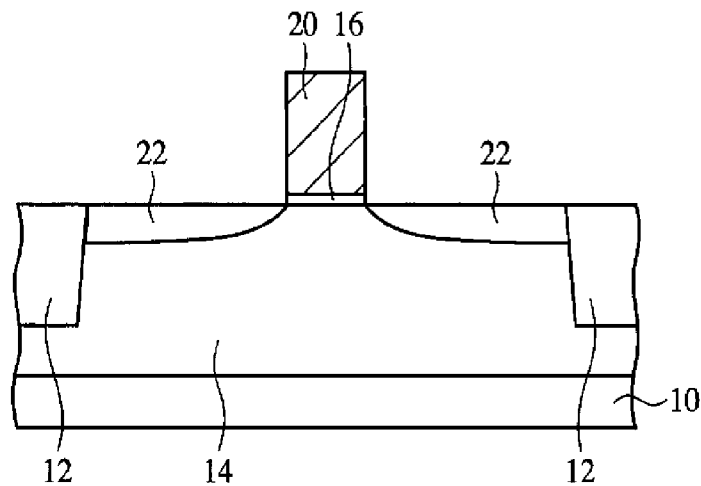

Then, ion implantation is made with the gate electrode 20 as the mask to form impurity diffused regions 22 to be extension regions or LDD regions in the silicon substrate 10 on both sides of the gate electrode 20 (FIG. 2A).

Figure 2B:
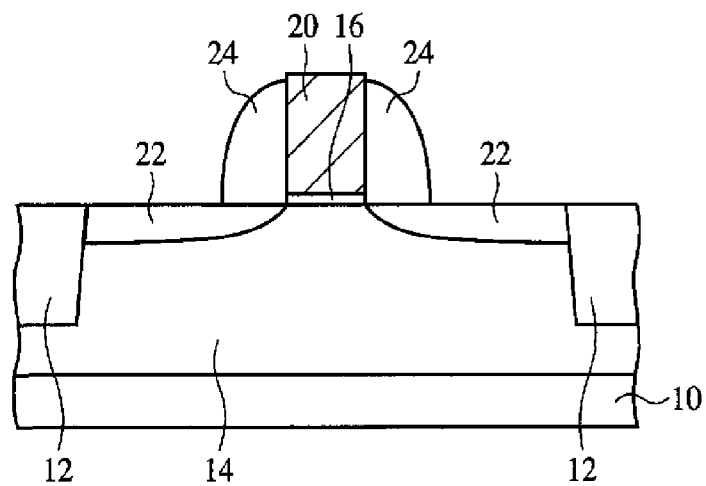

Next, silicon oxide film, for example, is deposited by, e.g., CVD method and is etched back to form a sidewall insulating film 24 of the silicon oxide film on the side walls of the gate electrode 20 (FIG. 2B).

Next, ion implantation is made with the gate electrode 20 and the sidewall insulating film 24 as the mask to form impurity diffused regions 26 in the silicon substrate 10 on both sides of the gate electrode 20.

Figure 2C:
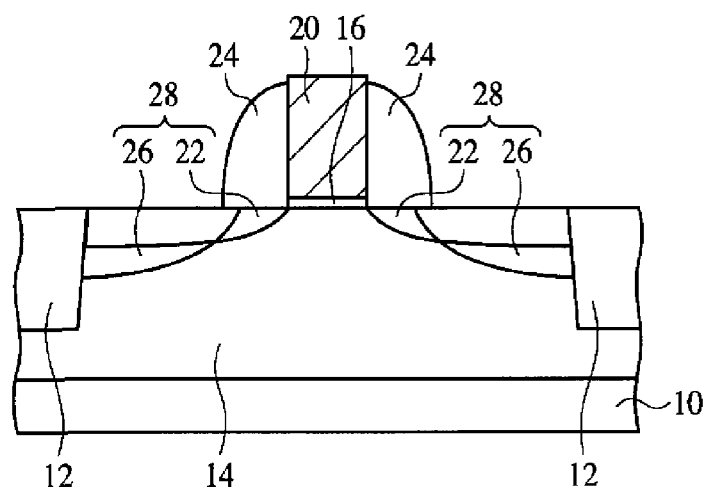

Next, rapid thermal annealing is made in, e.g., a nitrogen atmosphere to activate the implanted impurities to form source/drain regions 28 of the impurity diffused regions 22, 26 (FIG. 2C).

Figure 3A:
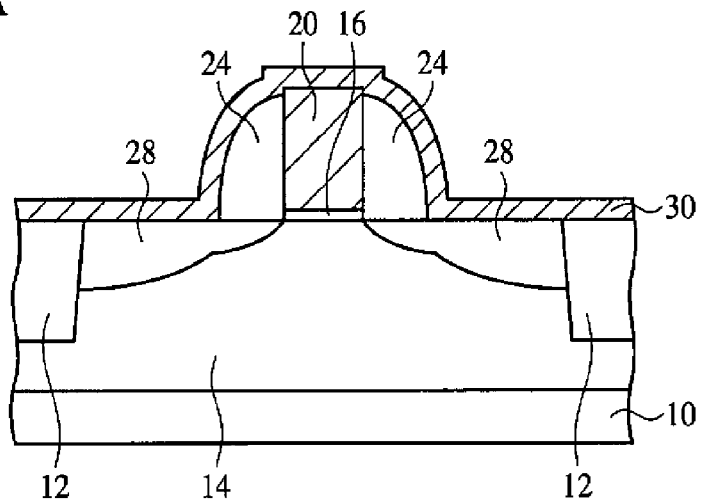

Next, over the entire surface, a metal alloy film 30 of, e.g., a 20 nm-thickness of, e.g., alloy of nickel (Ni) and platinum (Pt) (NiPt alloy) is deposited by, e.g., sputtering method (FIG. 3A). NiPt alloy target containing Pt by 5%, for example, can be used as the sputtering target.

Figure 3B:
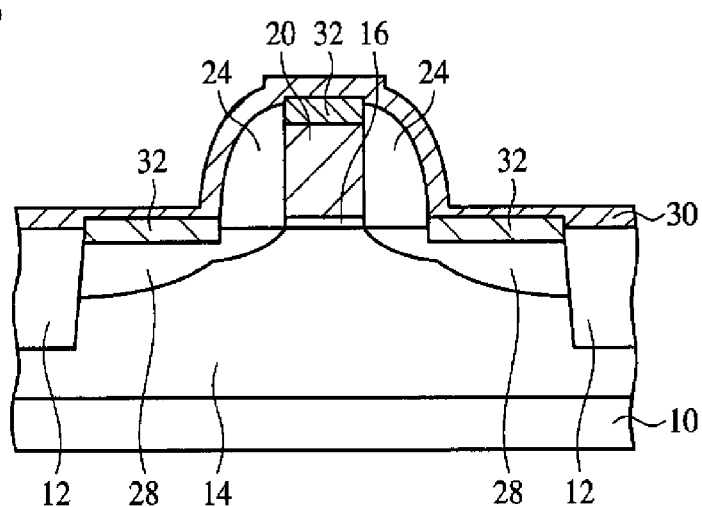

Next, thermal processing is made in, e.g., a vacuum or an nitrogen atmosphere to react the metal alloy film 30 and the silicon selectively on the source/drain regions 28 and the gate electrode 20, where the silicon is exposed to form metal silicide film 32 of NiPtSi on the source/drain regions 28 and the gate electrode 20 (FIG. 3B).

Next, the metal alloy film 30 remaining unreacted with the silicon is removed by wet etching.

Figure 3C:
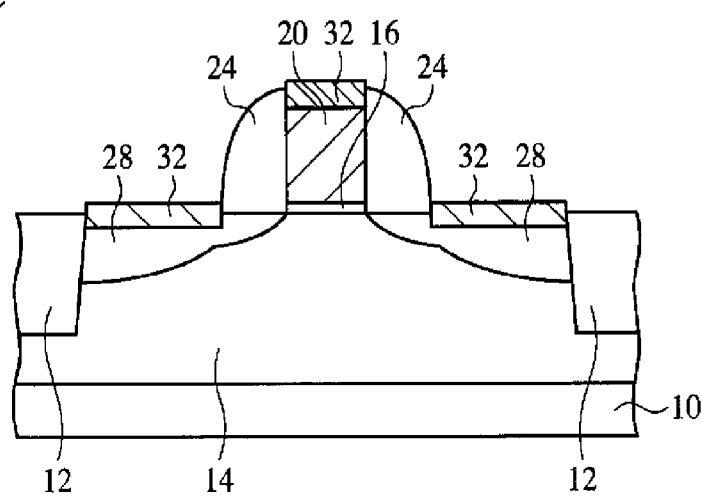

Thus, by the so-called salicide process, a metal silicide film 32 of NiPtSi is selectively formed on the gate electrode 20 and the source/drain regions 28 of a MISFET (FIG. 3C).

In the method of manufacturing the semiconductor device described above, the step of removing the metal alloy film remaining unreacted with the silicon by wet etching (the steps shown in FIGS. 3B and 3C) mainly characterizes the present invention.

The wet etching step, which is main characteristics of the present invention will be specifically explained with reference to FIGS. 4A to 5C.

Figure 4A:
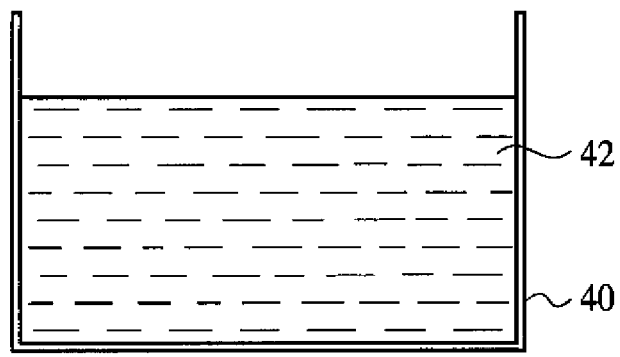
FIGS. 4A-4C and 5A-5C are views showing the method of removing the unreacted part of the metal alloy film in the method of manufacturing the semiconductor device according to the embodiment of the present invention.

First, a chemical liquid 42 of a mixture of, e.g., sulfuric acid and hydrogen peroxide (sulfuric acid hydrogen peroxide mixture (SPM)) is fed in a chemical liquid processing bath 40 and is adjusted to a prescribed processing temperature, e.g., 80° C. (FIG. 4A). The SPM is a chemical liquid generally used in the semiconductor manufacturing process.

The temperature of the chemical liquid 42 is set preferably at the temperature usually used in the semiconductor manufacturing process, e.g., not less than 70° C. Thus, no additional manufacturing equipment is necessary to be incorporated, and no operation cost increase is caused.

Figure 4B:
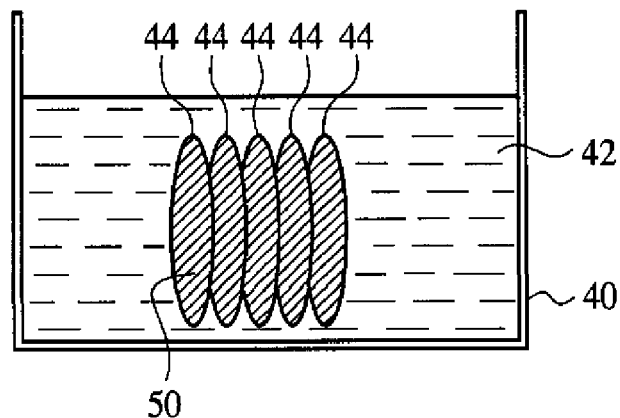

Then, a semiconductor substrate 44 with, e.g., cobalt (Co) film 50 formed on is immersed in the chemical liquid 42 in the chemical liquid processing bath 40 (FIG. 4B).

Figure 4C:
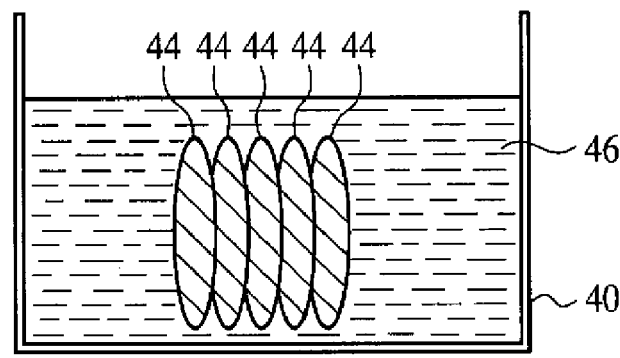

Thus, the cobalt formed on the semiconductor substrate 44 is dissolved into the chemical liquid 42. The etching solution 46 to be used in removing the metal alloy film 30 is thus prepared (FIG. 4C).

The semiconductor substrate 44 is different from the silicon substrate 10 which has been subjected to the steps of FIGS. 1A to 3B. The semiconductor substrate 44 can be a dummy wafer specialized in dissolving cobalt into the chemical liquid 42. Otherwise, when another product using cobalt is present, and the process of manufacturing the product includes the step of removing the cobalt, etc. (e.g., including the salicide process using cobalt), the step of FIG. 4B may be made as a step of processing the product water. Otherwise, in place of immersing the semiconductor substrate 44 with the cobalt film formed on in the chemical liquid 42, a mass of cobalt may be directly put in the chemical liquid 42.

Figure 5A:
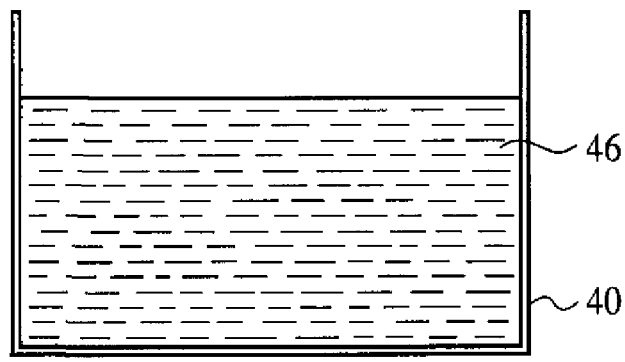

Next, the semiconductor substrate 44 is taken out of the chemical liquid processing bath 40 (FIG. 5A).

Figure 5B:
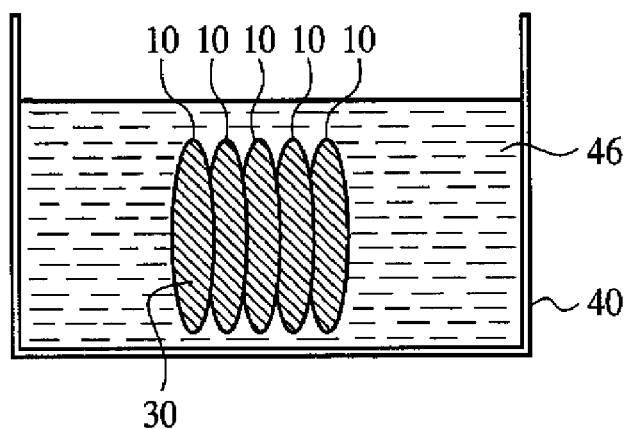

Then, the silicon substrate 10, which has been subjected to the steps up to FIG. 3B and has the metal alloy film 30 formed on is immersed in the etching solution 46 in the chemical liquid processing bath 40 (FIG. 5B). At this time, the etching solution 46 has the temperature adjusted to, e.g., 80° C., and the silicon substrate 10 is processed for, e.g., 12 minutes.

Figure 5C:
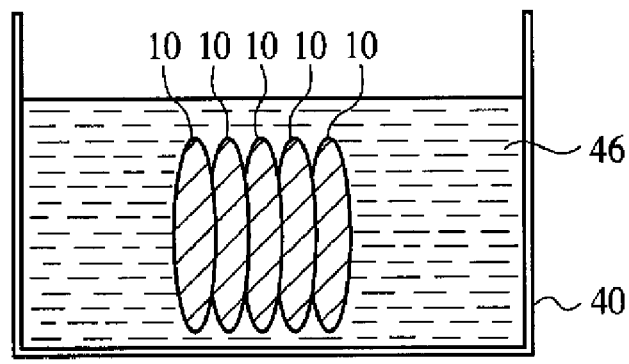

Thus, the metal alloy film 30 remaining unreacted with the silicon is selectively etched by the etching solution 46, and the structure shown in FIG. 3C is formed (FIG. 5C).

Then, the silicon substrate 10 is taken out of the chemical liquid processing bath 40, cleaned with water and dried, is subjected to a required manufacturing process, such as the following multilevel interconnection process, etc., and the semiconductor device is completed.

FIGS. 6A and 6B are plan views of distributions of defects on the silicon substrate after the metal alloy film has been removed. In FIG. 6A, the processing chemical liquid was the etching solution of the present embodiment, and in FIG. 6B, the processing chemical liquid was the usual SPM without cobalt dissolved in. A plurality of points in the drawings indicates the positions of the defects.

When the usual SPM was used in removing the metal alloy film 30, as shown in FIG. 6B, a number of defects are caused on the silicon substrate. These defects are platinum of the metal silicide film 32 which has not dissolve and remained as residues in the device isolation regions, etc. In contrast to this, when the etching solution of the present embodiment was used, as shown in FIG. 6A, the defects on the silicon substrate could be drastically decreased.

FIG. 7 is a graph of changes of the number of the defects with changes of the concentration of the cobalt dissolved in SPM. In the graph, the cobalt concentration is taken on the horizontal axis, and on the vertical axis, the number of the defects on the substrate surface.

As shown in FIG. 7, when the cobalt concentration in the SPM is less than 0.6 ppm, the effect of decreasing the defects is not sufficient. In contrast to this, with the cobalt concentration in the SPM set at not less than 0.6 ppm, the number of the defects can be decreased by 1 place or more.

In the above, cobalt is dissolved in the chemical liquid 42 to thereby prepare the etching solution 46, but in place of cobalt, titanium (Ti) may be used.

FIG. 8 is a graph of changes of the number of the defects with changes of the concentration of the titanium dissolved in SPM when titanium is dissolved in SPM. In the graph, the titanium concentration of the etching solution 46 is taken on the horizontal axis, and on the vertical axis, the number of the defects on the substrate surface.

As shown in FIG. 8, when the titanium concentration in the SPM is less than 0.6 ppm, the effect of decreasing the defect number is insufficient. In contrast to this, the number of the defects can be decreased by 1 placement or more by setting the titanium concentration at not less than 0.6 ppm.

As described above, titanium in place of cobalt is dissolved in SPM, whereby the same effect of decreasing the defects can be obtained.

Dissolving cobalt or titanium in the etching solution 46 too much will cause the risk of causing the characteristic degradation of the semiconductor device by metal contamination, and it is preferable to set the cobalt concentration or the titanium concentration in the etching solution 46 is set not more than about 10.0 ppm.

The mechanism for decreasing the residues of the platinum in removing the metal alloy film by dissolving cobalt or titanium in SPM is not clear, but the inventor of the present invention assumes as follows.

SPM contains hydrogen peroxide ($H_2O_2$), and after a metal is dissolved by sulfuric acid in preparing the chemical liquid and ionized, the following metal hydrate complex will be formed.

$$M^{X+} + nH_2O \rightarrow M(H_2O)n^{X+1} \quad (1)$$

In forming silicide using an alloy (NiPt), in addition to a metal for forming the silicide (nickel) and a noble metal (platinum), a metal which has higher ionization tendency than these metals (cobalt or titanium), have been in advance dissolved in the etching solution, whereby the metal element will form the metal hydrate complex expressed by Formula (1), and the noble metal (platinum) in the alloy will be coordinated to be thereby removed.

A metal element which has highly ionization tendency is required for the following reason.

First, a metal (cobalt) which has higher ionization tendency than a metal for forming the silicide (nickel) is used, whereby the metal hydrate complex expressed by Formula (1) is formed, but the liquid has a stable state (equilibrium state), which will facilitate the reaction for removing the noble metal (platinum).

A metal (cobalt) which has higher ionization tendency than a metal for forming the silicide (nickel) is used, whereby the given metal hydrate complex is active, and will more active on the noble metal (platinum). Inversely, when a metal element which has less ionization tendency than a metal (nickel) for forming the silicide is used, the given metal hydrate complex is less active and less reactive, and will not be able to remove the noble metal element.

In consideration of the above-described mechanism, as the chemical liquid for dissolve a metal element which has highly ionization tendency, an inorganic solution containing hydrogen peroxide, e.g., a mixture liquid of hydrochloric acid and hydrogen peroxide water (HPM) or a mixture liquid of ammonia and hydrogen peroxide water (APM) are expected to produce the same effect.

It is preferable that the mixing ratio of hydrogen peroxide in the etching liquid is 10-30% for SPM and about 50% for HPM and APM. These ranges of the mixing ratios are for setting the concentrations which make the activity of the respective mixture liquids highest to thereby most efficiently remove the metal for forming the silicide of the metal film 30 remaining unreacted with the silicon.

As described above, according to the present embodiment, in the method of manufacturing the semiconductor device including the step of forming metal silicide with an alloy containing a metal, such as Ni or others, and a noble metal, the alloy remaining unreacted is removed with an inorganic solution containing hydrogen peroxide and with a transition metal which has higher ionization tendency than the metal, whereby the alloy remaining unreacted can be removed without forming residues of the noble metal. The solution containing hydrogen peroxide is used in the usual semiconductor manufacturing steps, and the step can be made without incorporation additional manufacturing equipments or without causing the operation cost increase.

Modified Embodiments

The present invention is not limited to the above-described embodiment and can cover other various modifications.

For example, in the above-described embodiment, the alloy of a metal and a noble metal to be used in the salicide process is NiPt alloy. However, an alloy of the combination of another metal or another noble metal may be used. For example, other than nickel, cobalt, titanium, zirconium (Zr), ruthenium (Ru), palladium (Pd), hafnium (Hf), tungsten (W), tantalum (Ta) or others may be used. The noble metal can be gold (Au) or others, other than platinum.

A metal element dissolved in the etching solution can be a transition metal material which has higher ionization tendency than the metal forming the metal silicide. Such metal element is, e.g., scandium (Sc), vanadium (V), chrome (Cr), manganese (Mn), iron (Fe), nickel, copper (Cu), zinc (Zn), tantalum, tungsten or others.

For example, when nickel is used as the metal forming the metal silicide, the metal element dissolved in the etching solution can be, e.g., cobalt or titanium, as described above. When cobalt is used as the metal forming the metal silicide, the metal element dissolved in the etching solution can be, e.g., titanium.

In the above-described embodiment, the etching solution is prepared by dissolving a transition metal in SPM. However, the etching solution 46 may be prepared by mixing a solution with a transition metal dissolved in sulfuric acid, and hydrogen peroxide.

In the above-described embodiment, for the batch processing, the silicon substrate 10 is immersed in the etching solution 46. However, the semiconductor device manufacturing method according to the present invention is applicable to single wafer processing. The single wafer processing can be made by, e.g., mixing a solution of a transition metal element dissolved in sulfuric acid in hydrogen peroxide immediately before ejected to be ejected directly to the silicon substrate with a spray or a nozzle.

In these cases as well, HPM or APM maybe used.

In the above-described embodiment, the present invention is applied to the typical MISFET. However, the structure of the MISFET the present invention is applicable to is not limited to the above-described embodiment.

For example, in the present embodiment, the metal silicide film 32 is formed on the gate electrode 20 and the source/drain regions 28. However, the silicide film 32 may be formed on either of the gate electrode 20 and the source/drain regions 28. In this case, before the salicide process, an insulating film (e.g., silicon oxide film or silicon nitride film) for preventing the silicidation reaction may be formed on the source/drain regions 28 or on the gate electrode 20.

What is claimed is:

1. A method of manufacturing a semiconductor device comprising:

forming a metal alloy film of a metal and a noble metal over a semiconductor substrate having a region where silicon is partially exposed;

selectively reacting by thermal processing the silicon in the region with the metal alloy film to form a metal silicide film containing the metal and the noble metal on the region; and removing the metal alloy film remaining unreacted by using a solution, which is a mixture liquid of sulfuric acid and hydrogen peroxide, a mixture liquid of ammonia and hydrogen peroxide, or a mixture liquid of hydrochloric acid and hydrogen peroxide, with a transition metal, which has higher ionization tendency than the metal, dissolved in the solution, wherein the transition metal forms in the solution a metal hydrate complex thereof, in removing the metal alloy film, the noble metal in the metal alloy film is removed by coordinating the noble metal by the metal hydrate complex.

2. The method of manufacturing a semiconductor device according to claim 1, wherein
a mixing ratio of the hydrogen peroxide is 10-30%.

3. The method of manufacturing a semiconductor device according to claim 1, wherein
a concentration of the transition metal in the solution is 0.6-10.0 ppm.

4. The method of manufacturing a semiconductor device according to claim 1, wherein
a temperature of the solution is not less than 70° C.

5. The method of manufacturing a semiconductor device according to claim 1, further comprising:
immersing another semiconductor substrate having the transition metal formed thereon in the solution to thereby dissolve the transition metal into the solution.

6. The method of manufacturing a semiconductor device according to claim 1, wherein
the metal is nickel, and
the transition metal is cobalt or titanium.

7. The method of manufacturing a semiconductor device according to claim 1, wherein
the metal is cobalt, and
the transition metal is titanium.

8. The method of manufacturing a semiconductor device according to claim 1, wherein
the noble metal is platinum or gold.

9. The method of manufacturing a semiconductor device according to claim 1, wherein
the region is a gate electrode or the source/drain regions of a MISFET.

10. A method of manufacturing a semiconductor device comprising:
forming a metal alloy film of a metal and a noble metal over a semiconductor substrate having a region where silicon is partially exposed;
selectively reacting by thermal processing the silicon in the region with the metal alloy film to form a metal silicide film containing the metal and the noble metal on the region; and
removing the metal alloy film remaining unreacted by using a solution, which is a mixture liquid of sulfuric acid and hydrogen peroxide, with a transition metal, which has higher ionization tendency than the metal, dissolved in the solution, wherein
the transition metal forms in the solution a metal hydrate complex thereof,
in removing the metal alloy film, the noble metal in the metal alloy film is removed by coordinating the noble metal by the metal hydrate complex.

11. The method of manufacturing a semiconductor device according to claim 10, wherein
a mixing ratio of the hydrogen peroxide is 10-30%.

12. The method of manufacturing a semiconductor device according to claim 10, wherein
a concentration of the transition metal in the solution is 0.6-10.0 ppm.

13. The method of manufacturing a semiconductor device according to claim 10, wherein a temperature of the solution is not less than 70° C.

14. The method of manufacturing a semiconductor device according to claim 10, further comprising:
immersing another semiconductor substrate having the transition metal formed thereon in the solution to thereby dissolve the transition metal into the solution.

15. The method of manufacturing a semiconductor device according to claim 10, wherein
the metal is nickel, and
the transition metal is cobalt or titanium.

16. The method of manufacturing a semiconductor device according to claim 10, wherein
the metal is cobalt, and
the transition metal is titanium.

17. The method of manufacturing a semiconductor device according to claim 10, wherein
the noble metal is platinum or gold.

18. The method of manufacturing a semiconductor device according to claim 10, wherein
the region is a gate electrode or the source/drain regions of a MISFET.

* * * * *